United States Patent
Ollander et al.

(10) Patent No.: US 10,607,457 B1
(45) Date of Patent: Mar. 31, 2020

(54) ELECTRONICALLY CONTROLLED MOTOR-DRIVEN DEVICE WITH VIBRATIONAL ACOUSTIC ALERT CAPABILITY

(71) Applicant: Flowserve Management Company, Irving, TX (US)

(72) Inventors: Mark D Ollander, Forest, VA (US); Daniel E Carlson, Rustburg, VA (US); Michael Adam Rumore, Lynchburg, VA (US)

(73) Assignee: Flowserve Management Company, Irving, TX (US)

( * ) Notice: Subject to any disclaimer, the term of this patent is extended or adjusted under 35 U.S.C. 154(b) by 0 days.

(21) Appl. No.: 16/165,049

(22) Filed: Oct. 19, 2018

(51) Int. Cl.
*G08B 3/10* (2006.01)
*G01R 31/34* (2020.01)
*H02P 29/00* (2016.01)

(52) U.S. Cl.
CPC .............. *G08B 3/10* (2013.01); *G01R 31/343* (2013.01); *H02P 29/00* (2013.01)

(58) Field of Classification Search
None
See application file for complete search history.

(56) References Cited

U.S. PATENT DOCUMENTS

| | | | | |
|---|---|---|---|---|
| 5,726,911 A * | 3/1998 | Canada | ................ | G01R 31/343 318/434 |
| 6,529,135 B1 * | 3/2003 | Bowers | ............... | H02P 23/0077 318/806 |
| 7,034,711 B2 * | 4/2006 | Sakatani | ................ | G01H 1/003 340/682 |
| 7,782,217 B2 * | 8/2010 | Chiu | .................... | G01R 31/343 318/638 |
| 7,817,384 B2 * | 10/2010 | Woods | .................. | B24B 23/028 318/432 |
| 8,224,492 B2 * | 7/2012 | Lakomiak | .............. | G01H 1/003 340/683 |
| 8,442,688 B2 * | 5/2013 | Loutfi | ....................... | F27B 7/42 366/1 |
| 8,868,242 B2 * | 10/2014 | Loutfi | ...................... | F27B 7/42 700/17 |
| 2012/0130153 A1 * | 5/2012 | Bolyard | .............. | A61M 1/1086 600/17 |
| 2013/0234847 A1 * | 9/2013 | Carson | .................... | B60C 23/20 340/449 |
| 2014/0102389 A1 * | 4/2014 | Stolk | .................. | F01L 13/0036 123/90.15 |
| 2015/0123775 A1 * | 5/2015 | Kerdemelidis | .......... | G08B 6/00 340/407.1 |

(Continued)

*Primary Examiner* — Chico A Foxx
(74) *Attorney, Agent, or Firm* — Maine Cemota & Rardin

(57) ABSTRACT

An electronically controlled, motor-driven device is able to issue locally perceptible acoustic alerts by causing the electric motor to vibrate, which in embodiments can include vibrations at a resonant frequency of the device. Embodiments encode information relevant to the alert as amplitude and/or frequency modulations of the acoustic vibrational alerts. The motor can be an AC motor or a DC motor. In embodiments, the motor-driven device is an electronically controlled valve actuator or electronically controlled pump. The device can be in communication with a remote monitoring station, or the electronic controller can be remotely located.

21 Claims, 2 Drawing Sheets

(56) References Cited

U.S. PATENT DOCUMENTS

2015/0366631 A1* 12/2015 Kovnatsky .............. A61C 1/07
                                                     433/27
2018/0082563 A1*  3/2018 Cristella ................. G08B 3/10
2018/0243163 A1*  8/2018 Choudhury ........... A61H 23/02

* cited by examiner

ELECTRONICALLY CONTROLLED MOTOR-DRIVEN DEVICE WITH VIBRATIONAL ACOUSTIC ALERT CAPABILITY

FIELD OF THE INVENTION

The invention relates to devices having electronically controlled electric motors, such as electronically controlled valve actuators or pumps, and more particularly, to systems that monitor the status of electronically controlled, electric motor-driven devices.

BACKGROUND OF THE INVENTION

Devices that incorporate electric motors are used in a very wide range of applications. For applications that require sophisticated control of the electric motor, an electronic controller is often included in the device that is able to store parameters, implement complex control instructions, and monitor the status of the device. For example, an electronic controller can be used to control the speed and/or torque that is output by the motor according to a pre-defined profile that specifies the output torque as a function of the rotational position of the rotor.

An example of such an electronically controlled, motor-driven device is an electronically controlled, motor-driven valve actuator that is used, for example, to actuate a valve included in a process control system, or any other valve that requires sophisticated control of the valve actuation speed and/or the force or torque that is applied to the valve.

Often, although not always, devices with electronically controlled motors are in communication with a remote monitoring and control station that is able to receive status information from the electronic controller, and/or issue instructions to the controller. In other cases, the electronic controller itself may be situated remotely from the electric motor, which can create similar issues. It should be noted that, unless otherwise required by the context, disclosure presented herein with reference to remote "monitoring stations" are also applicable to remotely located electronic controllers.

Typically, if the electronic controller issues an urgent message, alert, or warning, it is received by the remote monitoring station and conveyed to users/operators of the device. If a plurality of similar devices is being simultaneously monitored and controlled by the remote station, then the alert issued by the control station may include identifying and/or location information that will allow the operator to determine which of the monitored devices requires attention.

Of course, the "monitoring station" may issue an alert to a mobile device such as a "smart phone" or laptop computer, or the monitoring station itself may be a mobile phone, laptop, or other computing device that is in wired or wireless communication with the electronic controller.

Unfortunately, when a large number of similar devices are being monitored, and/or when the monitored device is distant from the monitoring station and/or from the electronic controller, considerable time may be required before an operator receives an urgent alert and appropriate attention is given to the alerting device. It may be that no operator happens to be near the monitoring station when the alert is issued, or an appropriate mobile device may not be active at that moment. Once the alert is received, time may be required before the operator reaches the device that issued the alert. And if there is a plurality of similar devices in service at the same location, additional time may be required before the alerting device is identified.

Ironically, it is often the case that operating personnel are located in the vicinity of an alerting device, but may not become aware that attention is needed until someone near the monitoring station receives the alert and relays the information to personnel that are proximal to the alerting device. It can also happen that the alerting device includes a local monitoring display, but the local display is not within view of the nearby operators.

One approach is to include a perceptible alerting system as part of the electronically controlled, motor-driven device. For example, a flashing light, a local display, an acoustic speaker, or an audible siren can be co-located with the motor-driven device and activated by the electronic controller. In this manner, when an alert is issued, nearby personnel can become immediately aware that the device requires attention, and if there is a plurality of similar devices present, then the personnel can immediately identify which of the devices has issued the alert.

However, this approach is expensive, consumes additional space within or near the device, consumes additional power, and requires periodic testing and maintenance so as to ensure that the alerting system is functional. Furthermore, if the motor-driven device is located in a harsh environment, then this approach requires that the alerting system must be appropriately engineered and/or protected so that the environment does not degrade its function. If such alerts are relatively rare, as would be hoped, then the added expense of including such an alerting system can be prohibitive.

What is needed, therefore, is an apparatus and method of enabling an electronically controlled, motor-driven device to issue a local alert that will be perceptible to nearby operators, without adding to the cost, size, and/or power consumption of the motor-controlled device.

SUMMARY OF THE INVENTION

The present invention is an apparatus and method of enabling an electronically controlled, motor-driven device to issue a local alert that will be audibly perceptible to nearby operators, without adding to the cost, size, and/or power consumption of the motor-controlled device. According to the present invention, the electronic controller is able to direct control signals to the motor and/or to modulate the electrical current and/or voltage supplied to the motor in a manner that causes the motor to vibrate at an audible frequency. If it becomes necessary to issue a locally perceptible alert, the controller is configured to cause the motor to acoustically vibrate in a manner that will cause the motor-driven device to emit a vibrational sound that is perceptible to nearby personnel.

In embodiments, the motor is a three-phase AC motor with a variable frequency drive, or a DC motor with a current or voltage regulated motor controller.

In certain embodiments, the acoustic vibration is modulated. In various of these embodiments, the vibration is pulsed or otherwise modulated in amplitude, and or modulated in vibrational frequency (audible tone). In some of these embodiments, the modulation is used to encode information onto the local acoustic alert, so that nearby personnel receive information regarding the nature of the alert, as well as the existence and location of the alert.

In embodiments, one or more resonant vibrational frequencies of a housing surrounding the motor-driven device and/or of another component of the motor-driven device is identified, and when an alert is issued the motor is caused to vibrate at one or more of these resonant frequencies, so that the resulting sound is amplified by sympathetic vibration of the housing or other structure.

In various embodiments, the electronically controlled motor-driven device is an electric-motor driven valve actuator or pump that includes motor drive technology that enables electronic control of the motor.

For purposes of clarity and illustration, much of the disclosure herein is presented with reference to electric "motors" having "rotors" that "rotate." However, it should be understood that, except where context dictates otherwise, these references to "motors" should be broadly interpreted to refer to any and all electronically controlled electro-mechanical device components that perform functions of the device unrelated to the issuing of alerts and unrelated to transmitting of information, whereby the same electromechanical components can be actuated by the electronic controller so as to cause them to vibrate, and to thereby emit audible, acoustic sounds, without harm to the device or to associated equipment. Similarly, references herein to causing the rotor of a motor to "rotate" should be broadly interpreted to refer to any mechanical actuation of an electromechanical device component, such as linear actuation driven by a solenoid coil.

One general aspect of the present invention is an electronically controlled motor-driven device. The device includes an electric motor, and an electronic controller in controlling communication with the electric motor. the electronic controller is configured to monitor the motor-driven device and if the controller determines that an alert condition of the motor-driven device exists, cause the electric motor to vibrate so as to emit a vibrational output that can be audibly perceived by a nearby operator as a perceptible indication of the alert condition.

In embodiments, the electronic controller is further configured to determine information regarding the alert condition, and to encode said information as a modulation of the vibrational output that can be interpreted by the nearby operator. In some of these embodiments, the modulation includes at least one of an amplitude modulation and a vibrational frequency modulation of the vibrational output.

In any of the above embodiments, the electronic controller can be further configured to cause at least some of the vibrational output to be generated at a frequency that is equal to a resonant frequency of a structural component of the motor-driven device. In some of these embodiments, the structural component is a housing of the motor or a housing of the motor-driven device.

In any of the above embodiments, the motor can be an AC motor, and the electronic controller can control the motor via variable frequency drive technology.

In any of the above embodiments, the electronic controller can control the motor by timed energization of coils included in the motor.

In any of the above embodiments, the device can be in signal communication with a remote monitoring station, and can be further configured to communicate information regarding the alert condition to the remote monitoring station. In some of these embodiments, the remote monitoring station is a portable electronic device in wireless communication with the electronic controller.

In any of the above embodiments, the electronic controller can be physically remoted from the electric motor.

In any of the above embodiments, the device can be an electronically controlled valve actuator.

A second general aspect of the present invention is a method for causing an electronically controlled, motor-driven device to emit a locally perceptible acoustic alert. the method includes providing a device that includes an electric motor and an electronic controller in controlling communication with the electric motor, the electronic controller actuating the electric motor so as to provide an electromechanical output, monitoring of a status of the device by the electronic controller, and upon detection by the electronic controller of an alert condition of the device, the electronic controller causing the electric motor to vibrate in a manner that produces a vibrational output that is acoustically perceptible to a nearby operator.

Embodiments further include determining by the electronic controller of information regarding the alert condition, and encoding by the electronic controller of said information as a modulation of the vibrational output that can be discerned and interpreted by the nearby operator. In some of these embodiments the modulation includes at least one of an amplitude modulation and a vibrational frequency modulation of the vibrational output.

Any of the above embodiments can further include the electronic controller causing the vibrational output to be generated at a frequency that is equal to a resonant frequency of a structural component of the motor-driven device. In some of these embodiments the structural component is a housing of the motor or a housing of the motor-driven device.

In any of the above embodiments, the motor can be an AC motor, and the electronic controller can control the motor via variable frequency drive technology, or the motor can be a DC motor, and the electronic controller can control the motor by timed energization of coils included in the motor.

Any of the above embodiments can further include communicating by the electronic controller of information regarding the alert condition to a remote monitoring station. In some of these embodiments, the remote monitoring station is a portable electronic device in wireless communication with the electronic controller.

And in any of the above embodiments, the device can be an electronically controlled valve actuator.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention is an apparatus and method of enabling an electronically controlled, electric motor-driven device to issue a local alert that will be audibly perceptible to nearby operators, without adding to the cost, size, and/or power consumption of the motor-controlled device. According to the present invention, the electronic controller is able to direct control signals to the motor and/or to modulate the electrical current and/or voltage supplied to the motor in a manner that causes the motor to vibrate at an audible frequency. If it becomes necessary to issue a locally perceptible alert, the controller is configured to cause the motor to acoustically vibrate in a manner that will cause the motor-driven device to emit a vibrational sound that is perceptible to nearby personnel.

For purposes of clarity and illustration, much of the disclosure herein is presented with reference to electric "motors" having "rotors" that "rotate." However, it should be understood that, except where context dictates otherwise, these references to "motors" should be broadly interpreted to refer to any and all electronically controlled electro-mechanical device components that perform functions of the device unrelated to the issuing of alerts and unrelated to transmitting of information, whereby the same electromechanical components can be actuated by the electronic controller so as to cause them to vibrate, and to thereby emit audible, acoustic sounds, without harm to the device or to associated equipment. Similarly, references herein to causing the rotor of a motor to "rotate" should be broadly interpreted to refer to any mechanical actuation of an electromechanical device component, such as linear actuation caused by a solenoid coil.

Figure 1:
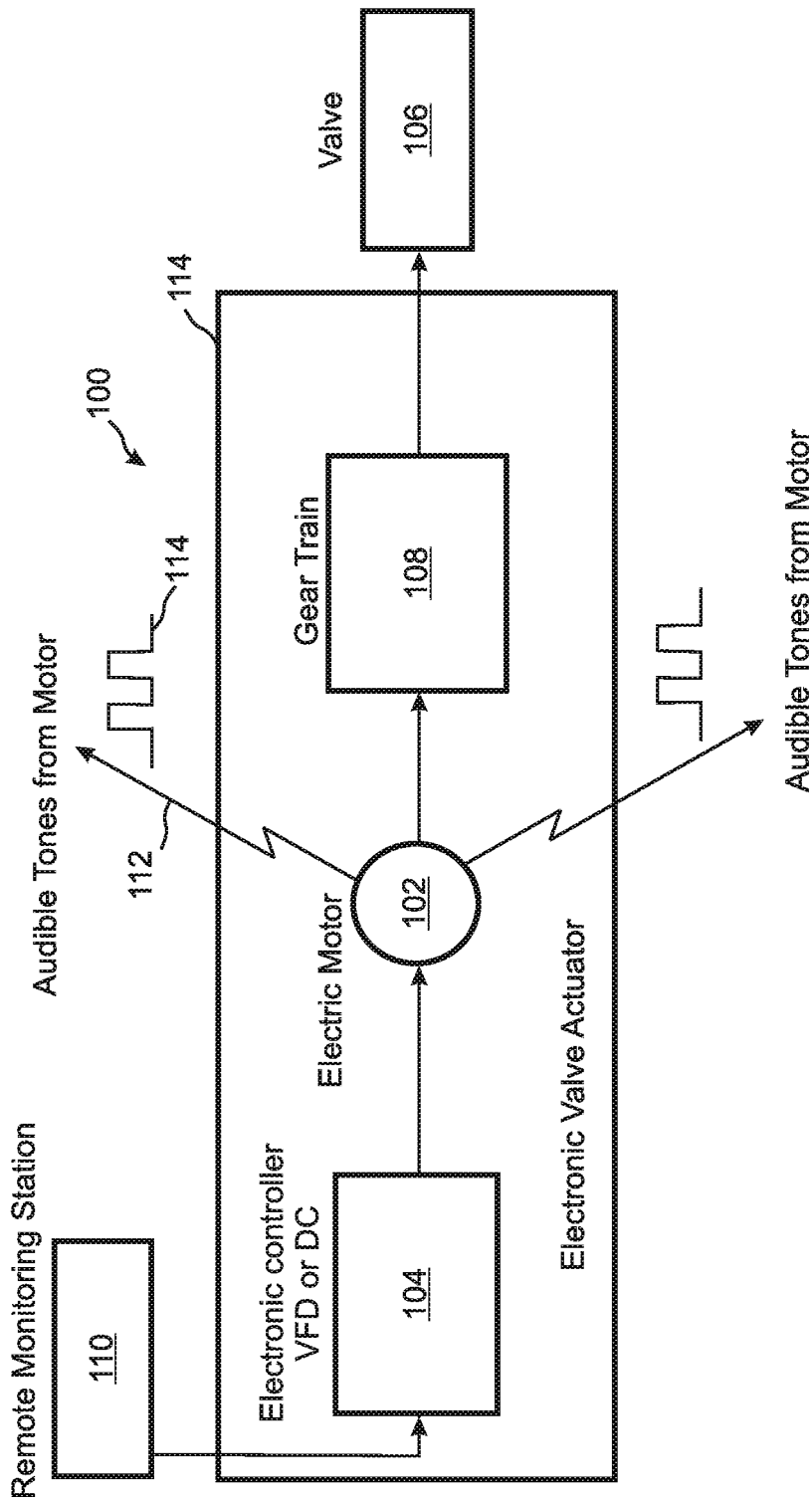
FIG. 1 is a block diagram illustrating an embodiment of the present invention that is an electronically controlled valve actuator.

As an example that is illustrative of the present invention, a block diagram of an embodiment directed to an electronically controlled, electric motor-driven valve actuator is presented in FIG. 1. In this embodiment, the actuator 100 includes an electric motor 102 that is controlled by an electronic controller 104 The motor 102 may be any suitable motor known in the art that can be controlled to produce an electromechanical output, and that can also be caused to vibrate so as to emit an audible sound or tone.

Numerous types of motor 102 are included within the scope of the present invention. Virtually any AC or DC motor can be included, including a single-phase or poly phase induction motor.

As has been noted above, the "motor" 102 can be any electromechanical component that can be caused to vibrate, including a linear actuator such a solenoid actuator.

The electronic controller 104 can be any controller known in the art that is capable of mechanically actuating and controlling an AC or DC motor 102 so as to cause an electromechanical output such as rotation of a rotor at a desired torque and/or speed, and also so as to cause the motor 102 to vibrate and thereby emit an audible acoustic vibration.

In the embodiment of FIG. 1, the force or torque that is produced by the motor 102 upon mechanical actuation thereof by the electronic controller 104 is applied to a valve stem 106 via a "gear train" 108. The electronic controller 104 is further in wired or wireless communication with a remote monitoring station 110, which receives status and alert messages from the electronic controller 104, and which issues commands to the electronic controller 104. In similar embodiments, the electronic controller 104 itself is situated remotely from the electric motor 102, which can create similar issues. It should be noted that, unless otherwise required by the context, disclosure presented herein with reference to remote "monitoring stations" are also applicable to remotely located electronic controllers.

In various embodiments, the "monitoring station" 110 is able to relay information and/or issue an alert to a mobile device such as a "smart phone" or laptop computer. In some embodiments, the monitoring station 110 is fixed in location. In other embodiments, the monitoring station itself 110 is a mobile phone, laptop, or other computing device that is in wired or wireless communication with the electronic controller 104.

If an alert condition occurs, for example an unacceptably high temperature within the actuator 100, or an electrical or mechanical fault of some kind, then the electronic controller 104 issues an alert. In embodiments, information regarding the alert is communicated to the remote monitoring station 110, which can include the nature of the alert, the time of the alert, and identifying information regarding the device that has issued the alert (if more than one such device is in communication with the monitoring station 110).

Simultaneously, or in embodiments after a specified period of time, the electronic controller 104 causes the motor to emit a local, acoustically audible alert 112 in the form of at least one vibrational "tone" 112. Specifically, the electronic controller 104 transmits signals to the motor 102 and/or modulates a voltage and/or current supplied to the motor 102 so as to cause the motor 102 to vibrate.

In certain embodiments, the acoustic vibration is modulated. For example, in the embodiment of FIG. 1 the amplitude of the vibration is pulsed 114, so that the audible alert is heard as a series of "beeps." In similar embodiments, the vibration otherwise modulated in amplitude, and/or modulated in frequency (audible pitch or tone). In some of these embodiments, the modulation is used to encode information onto the local acoustic alert, such as status, maintenance, and/or fault information, so that nearby personnel receive the information in addition to detecting the existence and location of the alert. For example, a certain pattern of "beeps" can be used to distinguish an overheating alert (e.g. a series of long beeps) from a mechanical failure (a series of short beeps) from an electronic failure (alternating long and short beeps).

In embodiments, one or more resonant vibrational frequencies of a housing surrounding the motor 102, of the actuator housing 114, and/or of another component of the actuator 100 is identified, and when an alert 112 is issued the motor 102 is caused to vibrate at one or more of these resonant frequencies, so that the resulting sound 112 is amplified by sympathetic vibration of the housing 114 or other structure.

Figure 2:
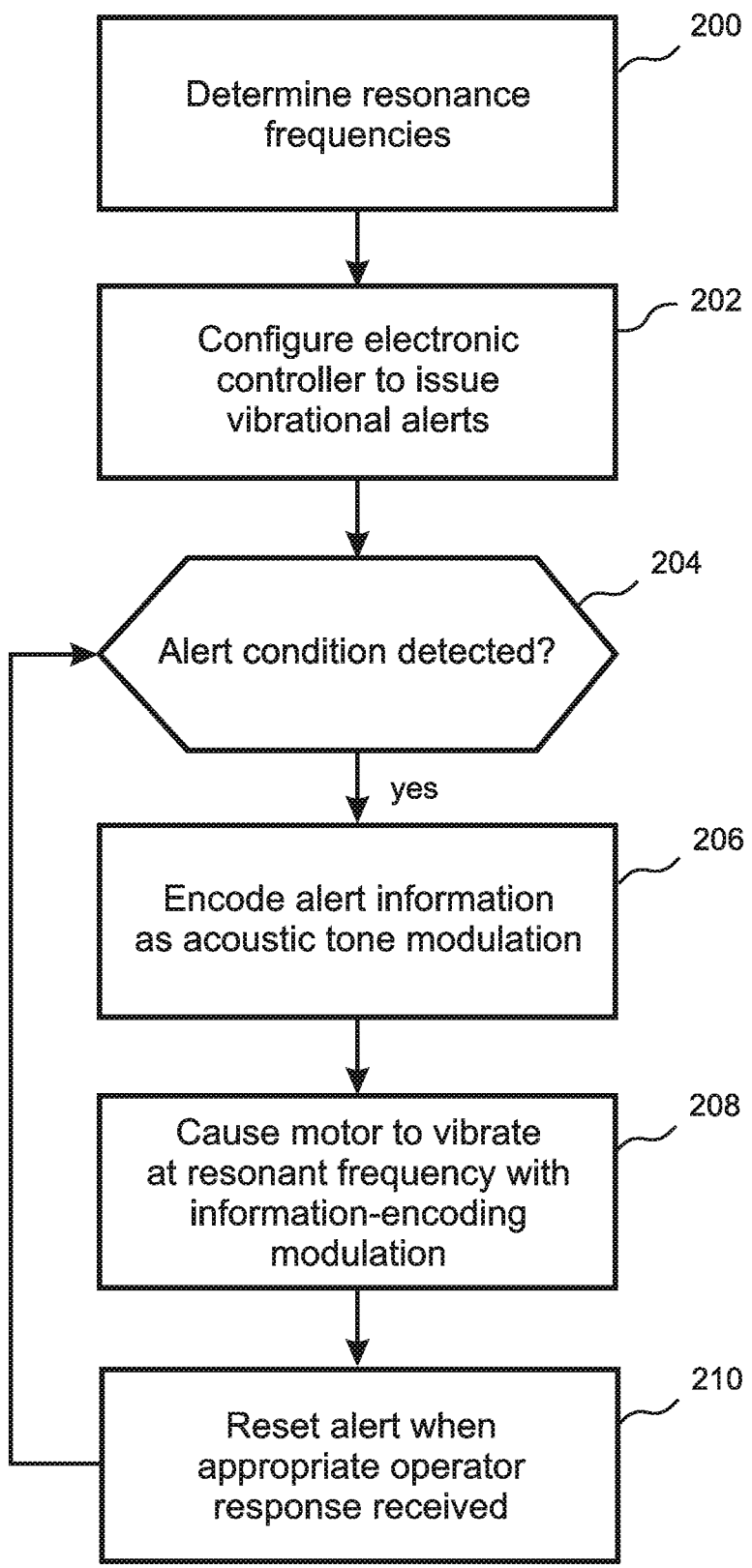
FIG. 2 is a flow diagram illustrating a method embodiment of the present invention.

With reference to FIG. 2, in embodiments the method of the present invention includes determining 200 one or more resonant frequencies 100 of a motor housing, device housing 114, or other component of the electronically controlled, motor-driven device 100, configuring 202 the electronic controller 104 to issue local, audible alerts by causing the motor 102 to vibrate and thereby emit an audible tone at one of the identified resonant frequencies, and monitoring 204 the device 100 during normal operation to detect if and when an alert condition occurs.

If and when an alert condition occurs, the method further includes encoding 206 by the electronic controller 104 of information relating to the alert condition as an amplitude and/or frequency modulation pattern 114 applicable to a vibrational alert 112, and causing 208 the motor 102 to vibrate at one ore more of the determined resonant frequencies so as to produce one or more audible, vibrational tones 112 that is/are modulated according to the determined modulation pattern 114. In embodiments, the audible, vibrational alert continues or repeats until an appropriate response to the alert is received, at which point the alert is reset 210 and the device 100 resumes normal operation unless and until another alert condition is detected.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications without departing from the spirit thereof. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. An electronically controlled, electric motor-driven device comprising:
    an electric motor configured to drive operation of the device; and
    an electronic controller in controlling communication with the electric motor;
    the electronic controller being configured to:
        monitor the device and;
        if the controller determines that an alert condition of the device exists, cause the electric motor to vibrate so as to emit a vibrational output that can be audibly perceived by a nearby operator as a perceptible indication of the alert condition.

2. The device of claim 1, wherein the electronic controller is further configured to determine information regarding the alert condition, and to encode said information as a modulation of the vibrational output that can be interpreted by the nearby operator.

3. The device of claim 2, wherein the modulation includes at least one of an amplitude modulation and a vibrational frequency modulation of the vibrational output.

4. The device of claim 1, wherein the electronic controller is further configured to cause at least some of the vibrational output to be generated at a frequency that is equal to a resonant frequency of a structural component of the electric motor-driven device.

5. The device of claim 4, wherein the structural component is a housing of the electric motor or a housing of the electric motor-driven device.

6. The device of claim 1, wherein the electric motor is an AC motor, and the electronic controller controls the electric motor via variable frequency drive technology.

7. The device of claim 1, wherein the electronic controller controls the electric motor by timed energization of coils included in the electric motor.

8. The device of claim 1, wherein the device is in signal communication with a remote monitoring station, and is further configured to communicate information regarding the alert condition to the remote monitoring station.

9. The device of claim 8, wherein the remote monitoring station is a portable electronic device in wireless communication with the electronic controller.

10. The device of claim 1, wherein the electronic controller is physically remoted from the electric motor.

11. The device of claim 1, wherein the device is an electronically controlled valve actuator.

12. A method for causing an electronically controlled, electric motor-driven device to emit a locally perceptible acoustic alert, the method comprising:
    providing a device that is driven by an electric motor and an electronic controller in controlling communication with the electric motor;
    the electronic controller actuating the electric motor so as to provide an electromechanical output;
    monitoring of a status of the device by the electronic controller; and
    upon detection by the electronic controller of an alert condition of the device, the electronic controller causing the electric motor to vibrate in a manner that produces a vibrational output that is acoustically perceptible to a nearby operator.

13. The method of claim 12, further comprising:
    determining by the electronic controller of information regarding the alert condition; and
    encoding by the electronic controller of said information as a modulation of the vibrational output that can be discerned and interpreted by the nearby operator.

14. The method of claim 13, wherein the modulation includes at least one of an amplitude modulation and a vibrational frequency modulation of the vibrational output.

15. The method of claim 12, further comprising the electronic controller causing the vibrational output to be generated at a frequency that is equal to a resonant frequency of a structural component of the electric motor-driven device.

16. The method of claim 15, wherein the structural component is a housing of the electric motor or a housing of the motor-driven device.

17. The method of claim 12, wherein the electric motor is an AC motor, and the electronic controller controls the electric motor via variable frequency drive technology.

18. The method of claim 12, wherein the electric motor is a DC motor, and the electronic controller controls the electric motor by timed energization of coils included in the motor.

19. The method of claim 12, further comprising communicating by the electronic controller of information regarding the alert condition to a remote monitoring station.

20. The method of claim 19, wherein the remote monitoring station is a portable electronic device in wireless communication with the electronic controller.

21. The method of claim 12, wherein the device is an electronically controlled valve actuator.

* * * * *